(12) United States Patent
Veneklasen et al.

(10) Patent No.: US 6,610,980 B2
(45) Date of Patent: Aug. 26, 2003

(54) APPARATUS FOR INSPECTION OF SEMICONDUCTOR WAFERS AND MASKS USING A LOW ENERGY ELECTRON MICROSCOPE WITH TWO ILLUMINATING BEAMS

(75) Inventors: Lee Veneklasen, Castro Valley, CA (US); David L. Adler, San Jose, CA (US); Matthew Marcus, Santa Clara, CA (US)

(73) Assignee: KLA-Tencor Corporation, San Jose, CA (US)

( * ) Notice: Subject to any disclaimer, the term of this patent is extended or adjusted under 35 U.S.C. 154(b) by 109 days.

(21) Appl. No.: 09/854,332

(22) Filed: May 11, 2001

(65) Prior Publication Data

US 2002/0070340 A1 Jun. 13, 2002

Related U.S. Application Data

(60) Provisional application No. 60/204,248, filed on May 15, 2000.

(51) Int. Cl.[7] .......................... G01N 23/00; G21K 7/00
(52) U.S. Cl. ...................... 250/310; 250/302; 250/305; 250/306; 250/251; 250/310; 378/84; 378/85
(58) Field of Search ................... 250/302, 305, 250/306, 251, 310; 378/84, 85

(56) References Cited

U.S. PATENT DOCUMENTS 5,444,242 A * 8/1995 Larson et al. ............... 250/305

OTHER PUBLICATIONS

L. Veneklasen, "The continuing development of the low energy electron microscope for characterizing surfaces", Dec. 1992, pp. 5513–5532, vol. 63, No. 12, Rev. Sci. Institute of Physics.

J. Chmelik et al. "Comparing cathode lens configuration for low energy electron microscopy", 1989, pp. 155–160, vol. 83, No. 5, OPTIK.

* cited by examiner

Primary Examiner—John R. Lee
Assistant Examiner—Erin-Michael Gill
(74) Attorney, Agent, or Firm—Okamoto & Benedicto LLP; Kevin McAndrews

(57) ABSTRACT

A novel dual beam low energy electron microscope (LEEM) apparatus for inspecting semiconductor circuits or masks. Direct imaging records many pixels in parallel, offering higher inspection rates than prior art scanning methods. A low energy flood beam is superimposed with a second, higher energy flood beam. The use of two beams avoids charging effects upon insulating or partially insulating substrates. Under appropriate conditions, the net charging flux to each image element can be balanced on a pixel by pixel, as well as global basis. Either the low energy or the higher energy beam may be used to form an image of the surface. An electron optical apparatus and configuration for this dual beam LEEM is described.

19 Claims, 3 Drawing Sheets

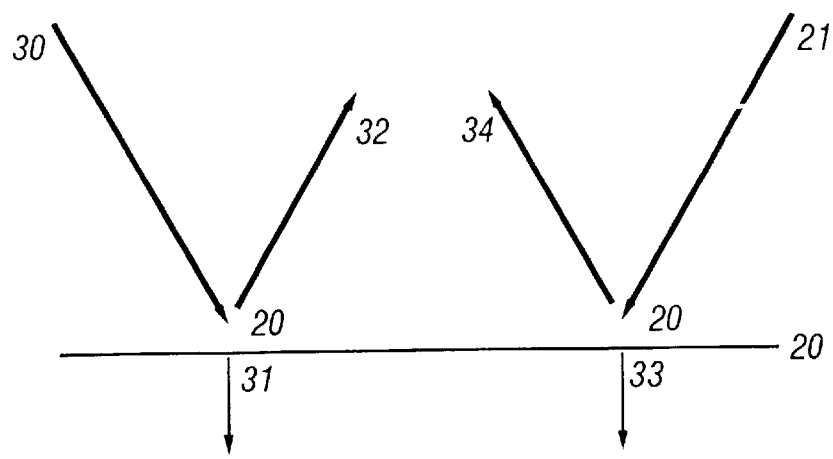
FIG. 2
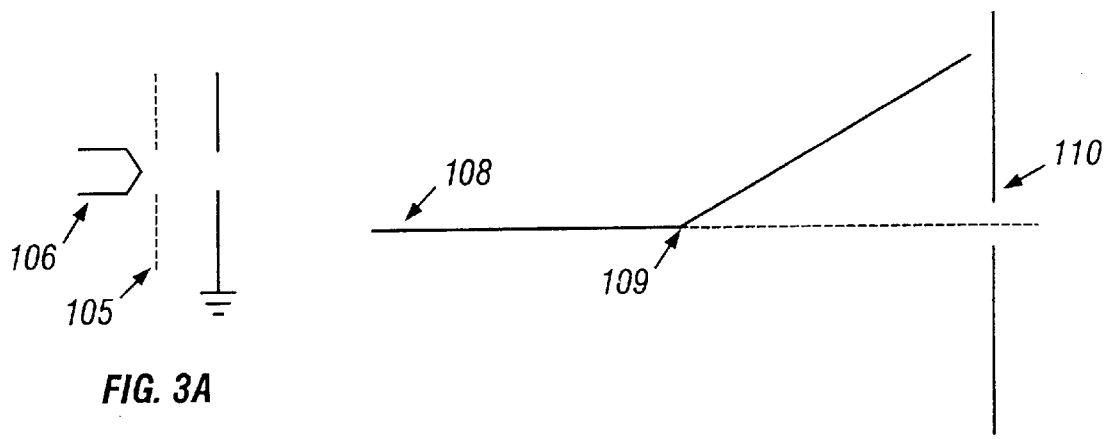
FIG. 3A
FIG. 3B
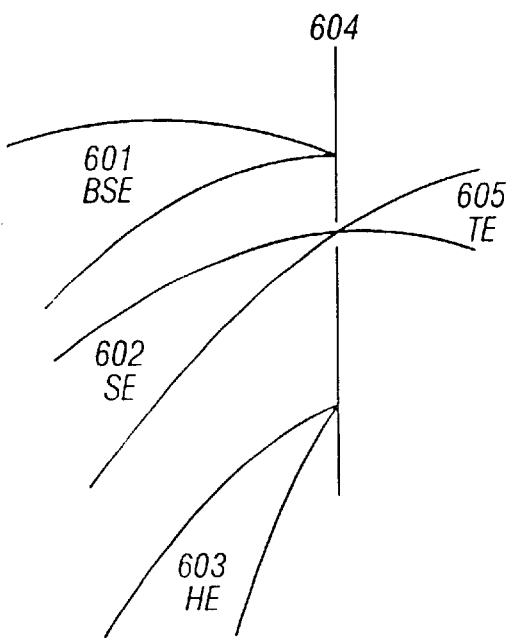
FIG. 5

APPARATUS FOR INSPECTION OF SEMICONDUCTOR WAFERS AND MASKS USING A LOW ENERGY ELECTRON MICROSCOPE WITH TWO ILLUMINATING BEAMS

This application claims the benefit of U.S. application Serial No. 60/204,248, filed May, 15, 2000.

FIELD OF THE INVENTION

This invention applies to the fields of wafer and mask inspection, inspection review and diagnosis, measurement of critical circuit dimensions, low energy electron microscopy, emission microscopy and scanning microscopy. This disclosure describes several novel improvements to the LEEM and other tools that make such tools attractive for semiconductor inspection, review and CD metrology applications. These improvements allow imaging of partially or fully insulating substrates, which is a necessary requirement for these applications.

BACKGROUND

The low energy emission microscope (LEEM) is a specialized electron microscope that forms images of surfaces. Some examples of prior art LEEM systems are described in the review paper: *"The continuing development of the low energy electron microscope for characterizing surfaces"* L. Veneklasen, *Rev. Sci. Inst.* 63(12) p. 5513, (December/1992) and in its references. The LEEM is a direct imaging (as opposed to scanning) microscope, more closely related to the transmission electron microscope than the scanning electron microscope. The LEEM includes a cathode lens whose negative electrode is an electrically conducting substrate surface. Images are formed from low energy electrons that are emitted, scattered or reflected from many points on the flat surface. The cathode lens accelerates and focuses these electrons to form an image. The image can be further magnified by a series of projection lenses acting upon the accelerated beam, and then recorded upon a scintillator screen viewed by a television camera. Resolution can be in the range of 5–100 nm, depending upon the field strength at the surface and the aperture angle used for imaging, as described in *"Comparing cathode lens configurations for low energy electron microscopy"*, J. Chmelik, L. Veneklasen and G. Marx, *OPTIK* 85:5 (1989) 155–60J.

A simplified prior art LEEM configuration is shown in FIG. 1. Prior art LEEMs use a single illumination beam 1 which is accelerated to about 10 to 30 keV in an electron gun 2. The beam passes through a separator magnet 3 that bends the beam into the axis of the cathode lens 4. An image of the gun crossover is transferred to the back focal (diffraction) plane 5 of the cathode lens, forming a parallel flood beam 6 that uniformly illuminates the substrate 7. The substrate is electrically floated at approximately the same voltage as the cathode of the electron gun, so that illuminating electrons are decelerated in the cathode lens, striking the substrate 7 at energies between 0 to about 1000 eV.

FIG. 1 shows the details of electron paths in the cathode lens. There is a high electric field at the substrate surface, so electrons leaving the substrate follow a parabolic path as they are re-accelerated in the lower part of the cathode lens. After passing through the lens, they form a crossover 9 at the back focal plane of the cathode lens 4. This distribution reflects the angular distribution of emission and reflection from the substrate. An aperture placed at this crossover point 9, or at its conjugate points 10 further down the beam path, can be used to obtain bright field image contrast by excluding from the image those electrons that have scattered or reflected at larger angles. Alternately, an offset or annular aperture may also be used for dark field imaging that only includes those electrons that have scattered or reflected at larger angles. After emerging from the cathode lens, the image beam 11 is bent in the opposite direction by the separator magnet 3. Additional projection lenses 12 and 13 further magnify the image before it strikes a scintillator screen 14 that is viewed by a TV camera 15.

Conventional LEEMs offer several imaging modes. When the voltage (surface potential) of the substrate surface is slightly more negative than the cathode, electrons turn around just before reaching the surface. Surface topography causes lateral electric fields near the substrate, which deflect low energy electrons in various directions; some following paths that do not pass through the contrast aperture in the imaging path. Since all illuminating electrons are reflected, this mirror imaging mode creates intense, high contrast images of substrate topography.

More positive substrate bias (5 to 30 eV landing energy) favors elastic backscatter images, where illumination electrons scatter from the surface without losing energy. Even more positive substrate bias (30 to 800 eV landing energy) generate secondary electron images, where different electrons are ejected from the surface with a wide angular distribution and energy spread. These images are less intense because many of the scattered electrons cannot pass through the contrast aperture.

Most prior art wafer and mask inspection systems use light optical images. Scanning electron beam microscopes (SEMs) have also been developed for inspection and CD measurement. Instead of forming a full field image, these SEM instruments scan a very small beam over the surface, and record the re-emitted secondary electrons in a single detector. Image acquisition tends to be slower than direct imaging light optical instruments because only one image element (pixel) at a time is recorded.

Prior art LEEMs can only image electrically conductive substrates. Imaging of semiconductor circuits poses a new challenge, for semiconductor wafers and chrome glass masks have insulating as well as conducting layers. A typical circuit consists of metal conductors, doped silicon, polysilicon, and oxide insulating regions arranged as continuous and isolated features on several layers. Some conducting traces and all insulating surfaces are not electrically connected to a grounded substrate layer.

Insulating surfaces are not a problem for light optical inspection because the scattering and reflection of light is insensitive to electrostatic charge on the surface. However, both scanning and direct imaging electron beam instruments exhibit charging effects. The rate that a given pixel element charges depends upon the difference between electron flux arriving at and leaving each pixel. The high current densities required for imaging at inspection rates imply a high rate of charging if the electron flux leaving the surface is not exactly balanced by that entering. Thus, the surface voltage can quickly reach levels detrimental to imaging or even sample integrity. Means of controlling local surface charging are therefore needed if electron microscopes are to be used for inspection of wafers and masks.

Prior art methods of controlling charging in scanning electron microscopes often involve the use of moderate energy illumination beams. There is usually a beam energy where the average charge leaving the substrate equals the average charge absorbed in the substrate. Various electrode configurations have been developed that allow some of the secondary electrons to return to the substrate to maintain charge balance, and are described in commonly assigned U.S. Pat. No. 5,502,306, which is incorporated by reference as though fully set forth herein. Side mounted ion and electron flood guns, and jets that supply gas to be ionized have also been used to supply clouds of very low energy charge to discharge the substrate. These methods can reduce the overall charging, but do little to eliminate the charging in the neighborhood of the scanned beam, which has much higher current density than the flood beam.

It is difficult to form mirror images of insulating surfaces in a prior art LEEM using a single low energy beam. An insulating surface is illuminated by a "low energy" electron beam, incident perpendicular to the surface with essentially low landing energy ($<\pm 0.5$ eV). This energy is too low to cause secondary emission, so the electrons may be either absorbed or reflected. Absorbed electrons charge the surface more negatively, causing more of the beam to be reflected. A balance is established where the surface is just barely negative enough to for leakage current to balance absorption. The surface potential can vary only within the range of energies in the illuminating beam.

Without a second higher energy beam, the mirror image from insulating surfaces is not very useful. When a surface is highly insulating, the leakage current is very low, and the surface still charges to a fairly high negative potential because the beam contains a very small fraction of electrons at a significantly higher energy than the average. This negative charging prevents most of the electrons from coming close to the surface, which in turn prevents high resolution mirror imaging from insulating areas. A second beam is needed to supply some positive charge to the insulating surface to keep it near the substrate potential.

It is also difficult to form backscatter or secondary electron images of insulating surfaces in a prior art LEEM using a single higher energy beam. The insulating surface is illuminated by a higher energy beam. Electrons may be absorbed or scattered, but their energy is too high for any to be reflected back before hitting the surface. When more electrons are absorbed than scattered, the surface charges negatively. When more are scattered (re-emitted) than are absorbed, the surface charges positively because each secondary electron leaves behind a positive charge. The surface will continue to charge until the insulating layer breaks down or until its surface potential adjusts to result in a landing energy that balances the leakage, absorption and scattering fluxes. The charging rate depends upon the difference in flux divided by the capacitance of the surface layer.

SUMMARY OF THE INVENTION

This invention involves a method and/or apparatus for imaging a substrate, comprising exposing the substrate to a first set of electrons, the first set of electrons having an energy selected to maintain surface voltage present on the substrate at a predetermined level and causing a fourth set of electrons to leave the substrate; exposing the substrate to a second set of electrons, the second set of electrons having an energy selected to cause a third set of electrons to leave said substrate, and detecting at least one of the third set or fourth set of electrons, thereby imaging a portion of the substrate.

BRIEF DESCRIPTION OF THE DRAWINGS

FIG. 2 is an illustration of the dual beam concept;

FIG. 3a illustrates a first type of blanking mechanism;

FIG. 3b illustrates a second type of blanking mechanism;

FIG. 5 illustrates the use of a contrast aperture.

DETAILED DESCRIPTION OF THE PREFERRED EMBODIMENTS

A. Reducing Charging Using Two Beams

Figure 1:
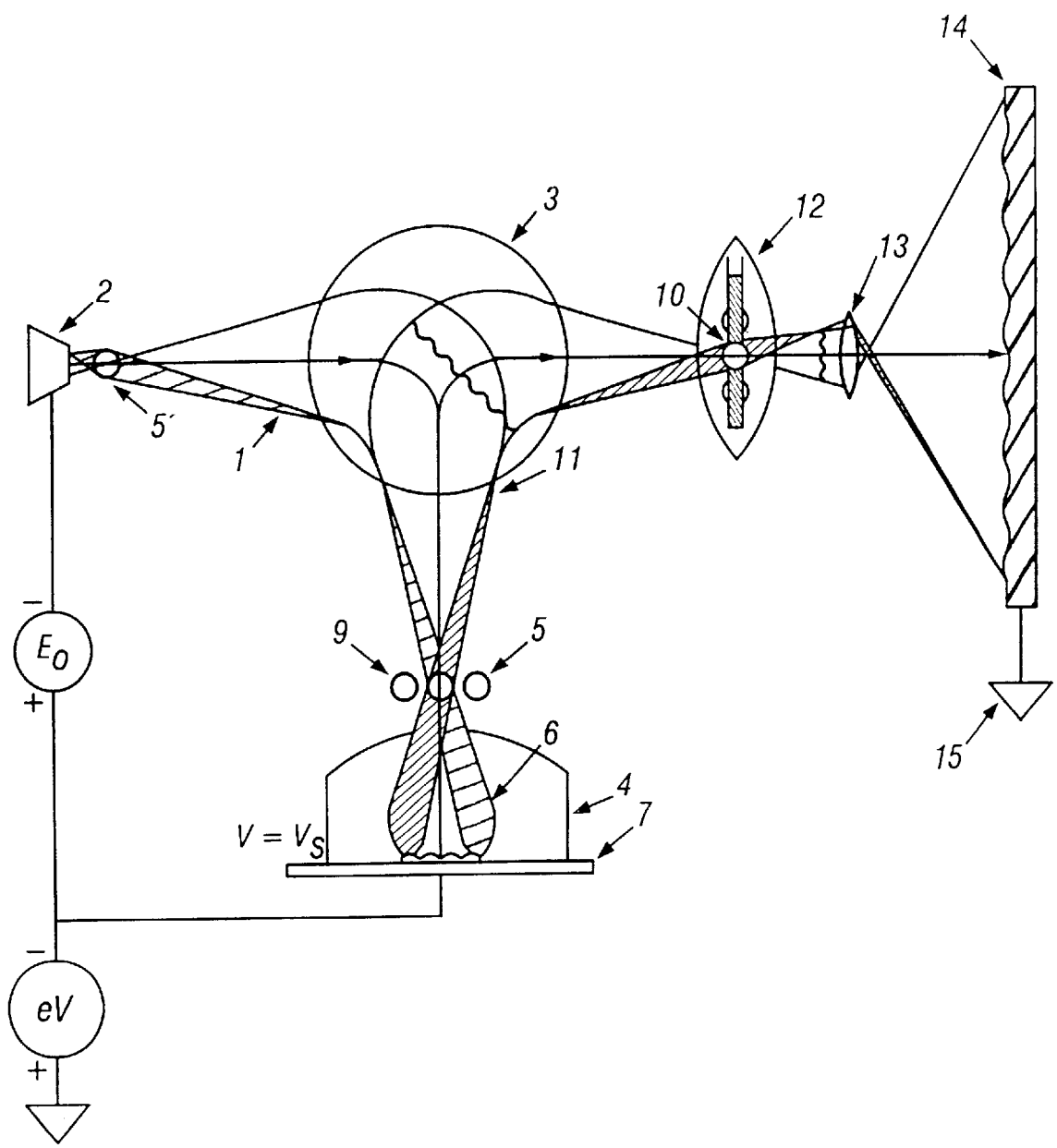
FIG. 1 is a LEEM system from the prior art.

To eliminate charging, the net flux density into and out of each image element (pixel) must be zero while the image of the pixel is being recorded. It must also be zero at all points that are electrically connected to the pixel being imaged. This section explains how this condition may be met in a LEEM using two superimposed flood beams with different energies.

FIG. 2 shows one example of the novel method of controlling charging on an insulating surface 20. A superimposed low energy beam 21 and a higher energy beam 30 both concurrently illuminate the same area upon the insulating surface 20. Electrons in the higher energy beam are absorbed 31 or scattered 32 in portions that depend upon the material and topography at each place upon the surface. As explained in connection with FIG. 2b, this higher energy beam can cause positive charging which will tend to create local charge imbalance. However, when the low energy beam 21 is superimposed, negative equalizing charge 33 may be absorbed from it as needed to re-establish the charge balance. Those electrons in the low energy beam 21 which are not absorbed are reflected 34. A local charge equilibrium can be automatically established by the appropriate selection of energy and flux of these beams, such that the potential of the insulating surface is locked within a selected range.

The dynamic equilibrium caused by the superposition of the two beams can be illustrated by moving the surface potential away from the low-energy cathode potential. The high-energy beam energy is chosen to have a positive-charging effect on the surface (yield greater than 1). In this case, the high-energy beam 30 causes more secondary and backscattered electrons to be ejected from the surface than are absorbed from the incident high-energy beam 30. Generally, this corresponds to a landing energy of 100 eV to 2000 eV for most materials. In the absence of a second flood beam, the surface would charge positively. However, the low-energy beam 21 will be attracted to the surface as it charges positively. Because these electrons have very low landing energy, many will be absorbed 33 without producing any secondary electrons, thus causing the surface 20 to charge negatively. If the high-energy beam 30 is very intense, the entire low-energy beam may be absorbed by the surface 20. Conversely, if the high-energy beam 30 is relatively weak or does not produce many secondary electrons, very little of the low-energy beam 21 will be absorbed. In these two cases, the surface voltage will not change by more than the energy spread of the low-energy beam 21, typically about 0.5 eV.

In the above description, it is seen that the intensity of the two beams must be such that the low-energy beam 21 can compensate for the charging of the high-energy beam 30. If the low-energy beam 21 is too weak, then even if it is completely absorbed by the surface there may still be positive charging resulting in loss of equilibrium of the surface voltage. Conversely, if the high-energy beam 30 is very weak, then very little of the low-energy beam 21 will be absorbed. This does not cause a loss of equilibrium, but may make the image formed from the reflected electrons have poorer resolution. Therefore, a proper balance between the two beams must be maintained. Generally speaking, having a low-energy beam 21 with a current density at least twice that of the high-energy beam 30 will guarantee voltage equilibrium. In no case should there be a location on the substrate in which the current density of the high-energy beam 30 is much greater in intensity than the low-energy beam 21.

Under these conditions, the surface potential will remain locked to the cathode potential of the low energy beam in spite of varying emission and scattering from different places on the surface. Leakage current is no longer an important factor determining surface potential. Surface potential variation due to charging effects is much less than when either beam is used separately, so both the mirror and secondary emission image will be better. This compensation occurs simultaneously and independently at each pixel site, without the need for charge transfer between pixels. Thus charge equilibrium is maintained at each pixel, solving the charging problem on a local as well as an overall basis.

Several kinds of imaging become possible in a LEEM using two beams of different energy. One mode forms an image of the secondary and backscattered electrons when the higher energy beam 30 interacts with the surface. In this mode, the low energy beam 21 supplies the excess negative charge to compensate for a positive charge that remains as the result of secondary emission from the surface 20.

Another mode forms a mirror image from low energy electrons 32 that are reflected near the surface 20. This mirror image is more intense than the secondary image because it is strongly collimated, allowing a larger fraction of the return beam to pass through the contrast aperture. Also, since the energy at the substrate is lower, the transverse momentum is low. In this mode, the scattering of the higher energy beam 30 serves to supply positive charge to balance the negative charge absorbed from the low energy beam 21. This brings the low-energy beam 21 closer to the surface, improving resolution. It also induces a reverse tone image in the mirror image because more of the low energy beam 21 is absorbed in regions with higher secondary emission.

The energy of the low energy beam 21 can be shifted to allow insulating parts of the surface to charge somewhat positive or negative. This induced voltage contrast may be observed in both the secondary and mirror image. This mode allows inspection for electrical as well as topographic defects.

These and other unique contrast modes are made possible by the novel use of two superimposed flood beams with different energies. Each mode may be used advantageously to find different kinds of defects or to measure the size and shape of features on wafers and masks. Pattern defects on wafers can be recognized by comparing nominally identical images of two or more different dies. In areas of a repeating pattern, defects may be located by detecting non-repeating features. Pattern defects on masks can be recognized by comparing the image with original pattern data. Differences indicate materials or topographic defects such as pinholes, bridges and breaks, feature edge deviations and CD variations. Comparing voltage contrast images reveals electrical defects not visible in topographic images. More sophisticated, diagnostic methods may be possible Such analysis may be made of the energy or angular distributions of the scattered electrons, possibly through the use of multiple detectors or filters.

B. Synchronous Detection for Separation of Images

Since they contain different kinds of information, it is desirable to separate the images originating from the high and low energy illuminating beams. One novel means of separating the low energy mirror and higher energy scattering images in a dual beam LEEM exploits the principle of synchronous detection. In this mode, the low energy beam and the higher energy beam are not superimposed, but rather are alternately turned on and off (toggled). The image is recorded only while the desired mirror or scattering image is present. During the unwanted part of the toggle cycle, the image beam is also blanked off.

To maintain the desirable charge balance from the low energy beam, the switching rates between the two images can be selected to meet certain conditions. The rate of change in surface potential (charge buildup) dV/dt depends upon the difference $J_a-J_s$ (charge/sec/sq.cm) between the absorbed ($J_a$) and scattered ($J_s$) current densities, and upon the surface layer capacitance C per square cm of surface area, in such a way that $dV/dt=(J_a-J_s)/C$. If $\Delta V$ is the tolerable increase in surface potential (approx. 0.1 Volt) during one cycle, then the beams must be toggled in a time less than $\Delta t < C\Delta V/(J_a-J_s)$. If the toggle time $\Delta t$ for an image element is sufficiently short, the image will behave as though the two beams were actually superimposed, even though the image from only one of the beams is observed. In comparison with the image subtraction method above, this method has the advantage of rejecting noise as well as contrast from the unwanted image.

This mode of operation requires that both the illumination beam and the image beam be turned on and off electron optically (blanked). FIGS. 3a and 3b show two methods for beam blanking. In FIG. 3a, the control grid 105 of an electron gun 106 is switched between two voltages to blank the illumination beams 107. The beam is off when the grid is biased sufficiently negative to prevent electrons from leaving the cathode. The beam is on when the grid is biased more positive. In FIG. 3b, a beam 108 is deflected (where the deflection is accomplished magnetically, electrostatically or both) at an image plane 109, so that it passes through an aperture 110 only when the beam should be unblanked. Both of these blanking methods may be applied in a dual beam LEEM to separate its images.

In another embodiment of the invention, both mirror mode and secondary/backscatter mode are used sequentially to create images having different characteristics. In this embodiment, each type of image is sequentially produced, as in the preceding embodiment. However, the image beam is not blanked off, because there is no unwanted part of the toggle cycle. Instead, each type of image is used to determine features of the substrate under observation. As an example, in an "array mode" or a "die to die mode" of semiconductor inspection, a mirror mode image of a first portion of a die is compared to a mirror mode image of a corresponding portion of an array from the same die (for array mode), or a corresponding portion of another die (for die to die mode). A similar die to die comparison or array comparison can then be performed for the secondary/backscatter image. Information derived from both types of comparison can be used to better identify and characterize defects on semiconductor substrates. A more detailed description of die to die mode comparison can be found in commonly assigned U.S. Pat. No. 5,502,306.

C. The Dual Beam LEEM Microscope Configuration

Figure 4:
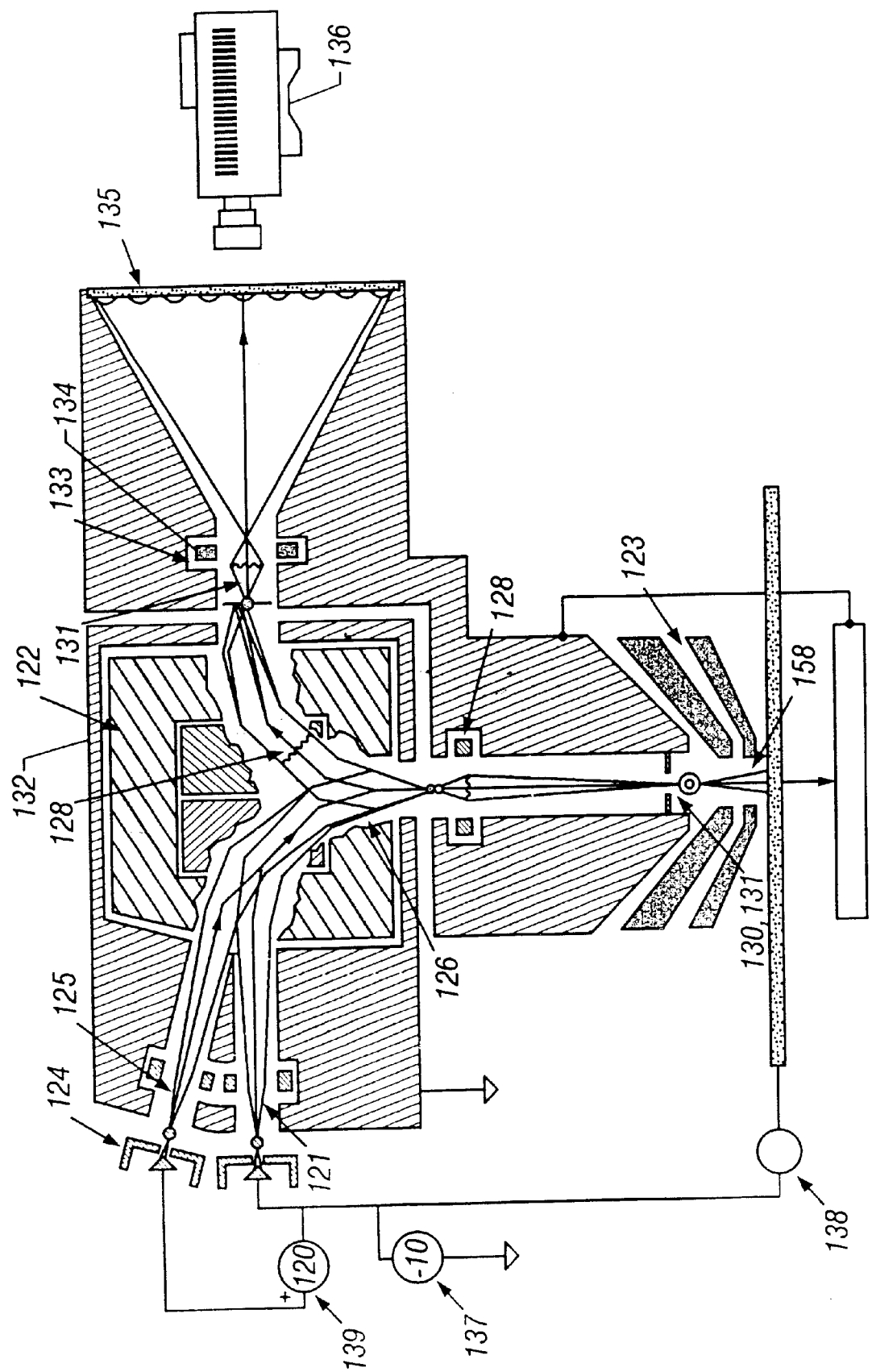
FIG. 4 illustrates an apparatus according to a preferred embodiment of the invention.

A simple diagram of the novel dual beam LEEM electron optical configuration is shown in FIG. 4. The electron gun 120 for the low energy beam 121 inserts this beam into the illumination portion of the magnetic separator 122, where it is bent into the axis of the cathode lens 123. A second gun 124 for the higher energy beam 125 is located slightly above and behind the low energy gun 120. Since its energy is somewhat higher, its beam 125 is bent through a smaller angle in the separator 122, allowing the two beam paths 126 to be superimposed where they enter the cathode lens 123. Either by accurate positioning, or with the help of auxiliary condenser lenses 128 the crossovers from both guns are imaged at their appropriate places 130 and 131 within the cathode lens 123. Within the cathode lens, the two beams are decelerated and collimated to form coincident and parallel flood beams 158 that illuminate the substrate 129.

Higher energy backscattered and secondary electrons along with low energy reflected electrons are re-accelerated and focused in the cathode lens 123, passing back upwards through the imaging portion of the magnetic separator 122, where they are bent into the axis of the imaging system 151. The image plane 132 is located in the middle of the separator, and a contrast aperture 133 is located at a conjugate crossover point along the imaging beam path. One or more additional projector lenses 134 provide further electron optical magnification before the image is recorded upon a scintillator screen 135. This screen is viewed by a TV camera 136, which records the final image.

The substrate 129 is the negative electrode of the cathode lens 123. The low-energy beam cathode is electrically floated upon a high voltage supply 137 at a voltage of about −10 to −30 kV. The substrate and high energy beam cathode are connected to the low-energy cathode through bias supplies 138 and 139. These two bias voltage supplies control the landing energy for both beams. Bias for the higher energy beam 125 is provided by power supply 139 of about +3 to −800 V. Bias for the substrate 129 is provided by much lower voltage supply 138, which varies by only a few volts according to imaging mode. This connection scheme is preferred over other alternatives because the low energy beam remains at fixed energy through most of the optical system, making electron optical alignment simpler.

The various imaging modes are set up by selecting bias voltages 138 and 139, and by choosing the size and location of the contrast aperture 133. It is desirable to be able to separate the mirror image from the secondary electron image. The energy dispersion of the separator slightly separates the low energy mirror and higher energy secondary electron image beams as they pass through the contrast aperture 133. The angular spread of the scattered image is larger than the mirror image since its electrons leave the cathode with a higher energy. The corresponding distribution of the secondary image upon the contrast aperture 133 can be larger and somewhat offset from that of the mirror beam. Thus placement and size of the contrast aperture help separate the two images.

FIG. 5 summarizes several ways that the invention may be implemented by use of the contrast aperture. Electron beams 601, 602 and 603 represent the backscattered, secondary and reflected electrons distributions, respectively, at the position of the contrast aperture 604. By positioning the aperture, different combinations of these electrons can be used to create the image. For example, FIG. 5 shows the aperture positioned so that the secondary electrons 602 are passed through the aperture to create the image, while the backscattered electrons 601 and the reflected electrons 603 are blocked. The position of the contrast aperture does not in any way affect the charge control at the surface of the substrate, only the image that is formed.

In U.S. Pat. No. 5,973,323, which is hereby incorporated by reference as though fully set forth herein, charge control in a secondary electron microscope (SEEM) was proposed by adjusting the landing energy of the illumination beam to balance this flux. However, in LEEM-type microscopes using a high field near the surface, it is more difficult, depending on substrate, to create this charge-balance condition before breakdown of the insulator occurs. Even if this balance is achieved, the surface charging present can substantially distort the fields. Thus, the charge control techniques of the present invention can be used in a system such as that of U.S. Pat. No. 5,973,323 to further improve image quality and better control charge. One way in which the charge control techniques of the present invention may be integrated into such a system is disclosed in Provisional Patent Application Serial No. 60/135742, filed on May 25, 1999 by Adler et al. This provisional patent application is hereby incorporated by reference as though fully set forth herein.

The apparatus and method of this invention can be used in the inspection or metrology of various substrates, such as semiconductor wafers, photomasks, reticles, stencil masks, SCALPEL masks, EUV masks, x-ray masks, and the like.

As previously discussed, these modes are not exclusive. An image beam containing any desired combination of reflected, secondary and backscattered electrons can be detected, to produce an image having desired characteristics. These modes can be used sequentially as well, if desired.

Although the invention has been described in relation to various implementations, together with modifications, variations, and extensions thereof, other implementations, modifications, variations and extensions are within the scope of the invention. Other embodiments may be apparent to those skilled in the art from consideration of the specification and invention disclosed herein. The invention is therefore not limited by the description contained herein or by the drawings, but only by the claims and their equivalents.

What is claimed is:

1. A method for imaging insulating or partially insulating substrates to find and characterize manufacturing defects, comprising:
    a) exposing said substrate to a first set of electrons traveling along a first path, said first set of electrons having an energy selected to maintain surface voltage present on said substrate at a predetermined level and causing a fourth set of electrons to leave said substrate;
    b) exposing said substrate to a second set of electrons traveling along a second path, said second set of electrons having an energy selected to cause a third set of electrons to leave said substrate; and
    c) detecting at least one of said third set or fourth set of electrons, thereby imaging a portion of said substrate,
    wherein the first and second paths have an end section which is common to both the paths such that the first and second sets of electrons both flood same said portion of said substrate.

2. The method of claim 1, wherein said fourth set of electrons is reflected from said substrate.

3. The method of claim 1, wherein said third set of electrons are secondary or backscattered electrons from said substrate.

4. The method of claim 1, wherein said substrate is concurrently exposed to said first and second sets of electrons.

5. The method of claim 1, wherein said substrate is alternately exposed to said first and second sets of electrons.

6. The method of claim 1, wherein said method is performed in a LEEM.

7. The method of claim 1, wherein said method is performed in a SEEM.

8. The method of claim 1, wherein at least one of said third set or fourth set of electrons is filtered using an energy filter.

9. The method of claim 1, wherein said substrate is exposed to said first set of electrons over a first area, said substrate is exposed to said second set of electrons over a second area, and said second area is substantially contained within said first area.

10. The method of claim 1, wherein said first set of electrons has an energy higher than said second set of electrons, and wherein said first set of electrons causes secondary electrons to be emitted from said substrate, such that positive charging caused by said first set of electrons is offset by negative charging caused by said second set of electrons, whereby a surface potential of said substrate is locked within a desired range.

11. The method of claim 1, wherein said second set of electrons has an energy higher that said first set of electrons, and wherein said second set of electrons causes secondary electrons to be emitted from said substrate, such that positive charging caused by said second set of electrons is offset by negative charging caused by said first set of electrons, whereby a surface potential of said substrate is locked within a desired range.

12. An apparatus for imaging insulating or partially insulating substrates to find and characterize manufacturing defects, comprising:

a) means for exposing said substrate to a first set of electrons traveling along a first path, said first set of electrons having an energy selected to maintain surface voltage present on said substrate at a predetermined level and causing a fourth set of electrons to leave said substrate;

b) means for exposing said substrate to a second set of electrons traveling along a second path, said second set of electrons having an energy selected to cause a third set of electrons to leave said substrate; and c) means for detecting at least one of said third set or fourth set of electrons, thereby imaging a portion of said substrate, wherein the first and second paths have an end section which is common to both the paths such that the first and second sets of electrons both flood same said portion of said substrate.

13. An apparatus for imaging insulating a partially insulating substrates to find and characterize manufacturing defects a substrate, comprising:

a) a first beam traveling along a first path and exposing substrate to a first set of electrons, said first set of electrons having an energy selected to maintain surface voltage present on said substrate at a predetermined level and to cause a fourth set of electrons to leave said substrate;

b) a second beam traveling along a second path and exposing said substrate to a second set of electrons, said second set of electrons having an energy selected to cause a third set of electrons to leave said substrate; and d) a sensor detecting at least one of said third set or fourth set of electrons, thereby imaging a portion of said substrate, wherein the first and second paths have an end section which is common to both the paths such that the first and second sets of electrons both flood same said portion of said substrate.

14. The apparatus of claim 13, wherein said apparatus is a LEEM.

15. The apparatus of claim 13, wherein said apparatus is a SEEM.

16. The method of claim 1, wherein the a relative energy of at least one of said first and second sets of electrons is varied until the voltage of said substrate is locked within a desired range.

17. The method of claim 16, wherein said relative energy is varied manually by an operator.

18. The method of claim 16, wherein said relative is varied automatically to optimize image contrast.

19. The method of claim 1, wherein said substrate comprises an array of vias or contacts in an insulator over the semiconductor substrate, and wherein contrast between said insulator and said substrate or a metal layer is used to detect open vias or contacts within said array.

* * * * *